US007932847B1

(12) United States Patent
Hsieh et al.

(10) Patent No.: US 7,932,847 B1
(45) Date of Patent: Apr. 26, 2011

(54) HYBRID COARSE-FINE TIME-TO-DIGITAL CONVERTER

(75) Inventors: Hong-Yean Hsieh, Santa Clara, CA (US); Chao-Cheng Lee, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/631,005

(22) Filed: Dec. 4, 2009

(51) Int. Cl.
*H03M 1/12* (2006.01)

(52) U.S. Cl. ........................................ 341/155; 341/156

(58) Field of Classification Search .................. 341/155, 341/156, 143
See application file for complete search history.

(56) References Cited

U.S. PATENT DOCUMENTS 7,536,299 B2 * 5/2009 Cheng et al. .................. 704/203
2007/0273569 A1 * 11/2007 Lin ............................... 341/155

* cited by examiner

*Primary Examiner* — Jean B Jeanglaude
(74) *Attorney, Agent, or Firm* — Thomas, Kayden, Horstemeyer & Risley, LLP

(57) ABSTRACT

A hybrid coarse-fine time-to-digital converter is disclosed. The hybrid coarse-fine time-to-digital converter is configured to receive a first input signal and a second input signal and to generate a digital output that corresponds to the time difference of between a rising edge of the first input signal and a rising edge of the second input signal. The hybrid coarse-fine time-to-digital converter comprises a coarse time-to-digital converter, a fine time-to-digital converter, and a correlated output generator.

17 Claims, 11 Drawing Sheets

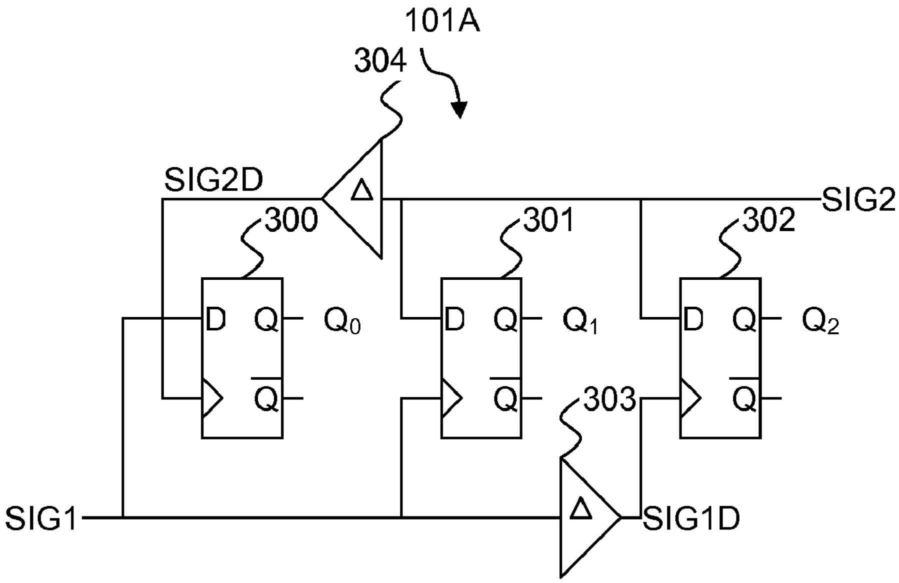
*FIG. 3(a)*
| $Q_2Q_1Q_0$ | OUT1 |
|---|---|
| 110 | +2 |
| 010 | +1 |
| 000 | -1 |
| 001 | -2 |
*FIG. 3(b)*
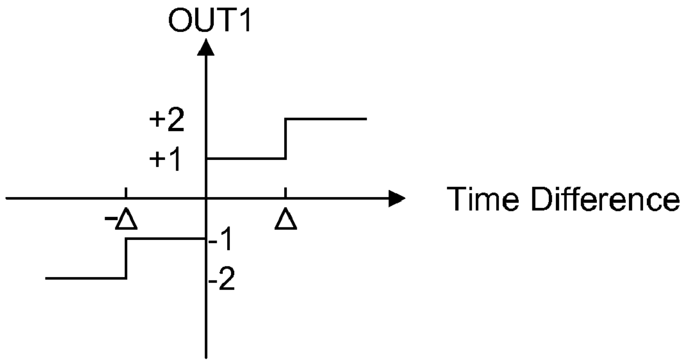
*FIG. 3(c)*

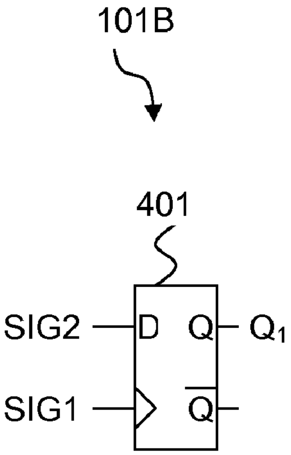
*FIG. 4(a)*
| $Q_1$ | OUT1 |
|---|---|
| 0 | +1 |
| 1 | -1 |
*FIG. 4(b)*
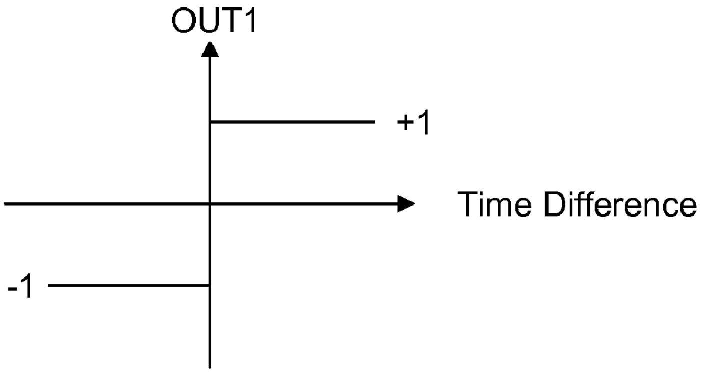
*FIG. 4(c)*

HYBRID COARSE-FINE TIME-TO-DIGITAL CONVERTER

BACKGROUND OF THE INVENTION

1. Field of the Invention

The present invention relates generally to the design of a time-to-digital converter, and more particularly to a hybrid coarse-fine time-to-digital converter.

2. Description of the Background Art

A time-to-digital converter is usually employed to measure the time difference of two input signals. The performance of a time-to-digital converter is characterized by its linearity, offset, and resolution. The finer resolution results in a much smaller quantization noise in any application. A coarse time-to-digital converter usually has very small offset and better linearity while its quantization resolution is generally much larger. Though a fine time-to-digital converter results in a smaller quantization noise, it has a comparably large offset and worse linearity, which are quite sensitive to process, voltage, and temperature variations.

To achieve a finer quantization resolution, a low offset, and a good linearity, a hybrid coarse-fine time-to-digital converter is proposed in the invention.

SUMMARY

The present invention pertains to a time-to-digital converter.

In one embodiment, a hybrid coarse-fine time-to-digital converter is disclosed in accordance with the present invention. The hybrid coarse-fine time-to-digital converter is configured to receive a first input signal and a second input signal and to generate a digital output that corresponds to the time difference of between a rising edge of the first input signal and a rising edge of the second input signal. The hybrid coarse-fine time-to-digital converter comprises a coarse time-to-digital converter, a fine time-to-digital converter, and a correlated output generator. Corresponding to each time difference, the coarse time-to-digital converter generates a first intermediate output that provides a low offset output and better linearity. The fine time-to-digital converter generates a second intermediate output that provides a finer quantization resolution of the time difference. In order to correlate the first and second intermediate outputs, the correlated output generator first generates a quantization level corresponding to each first intermediate output transition. The generated quantization levels are then used to map the first and second intermediate outputs to the final digital output.

These and other features of the present invention will be readily apparent to persons of ordinary skill in the art upon reading the entirety of this disclosure, which includes the accompanying drawings and claims.

DESCRIPTION OF THE DRAWINGS

FIG. 2(*b*) shows an input-output transfer function curve of the hybrid coarse-fine time-to-digital converter in FIG. 1.

FIG. 3(*a*) schematically shows a coarse time-to-digital converter in accordance with an embodiment of the present invention.

FIG. 3(*b*) shows the truth table of the coarse time-to-digital convert in FIG. 3(*a*) in accordance with an embodiment of the present invention.

FIG. 3(*c*) shows an input-output transfer function curve of the coarse time-to-digital converter in FIG. 3(*a*).

FIG. 4(*a*) schematically shows a coarse time-to-digital converter in accordance with an embodiment of the present invention.

FIG. 4(*b*) shows the truth table of the coarse time-to-digital convert in FIG. 4(*a*) in accordance with an embodiment of the present invention.

FIG. 4(*c*) shows an input-output transfer function curve of the coarse time-to-digital converter in FIG. 4(*a*).

FIG. 6(*b*) shows a timing diagram of the time amplifier in FIG. 10(*a*).

FIG. 8(*b*) shows a quantization level calibration circuit in accordance with an embodiment of the present invention.

FIG. 8(*c*) shows an output combiner in accordance with an embodiment of the present invention.

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
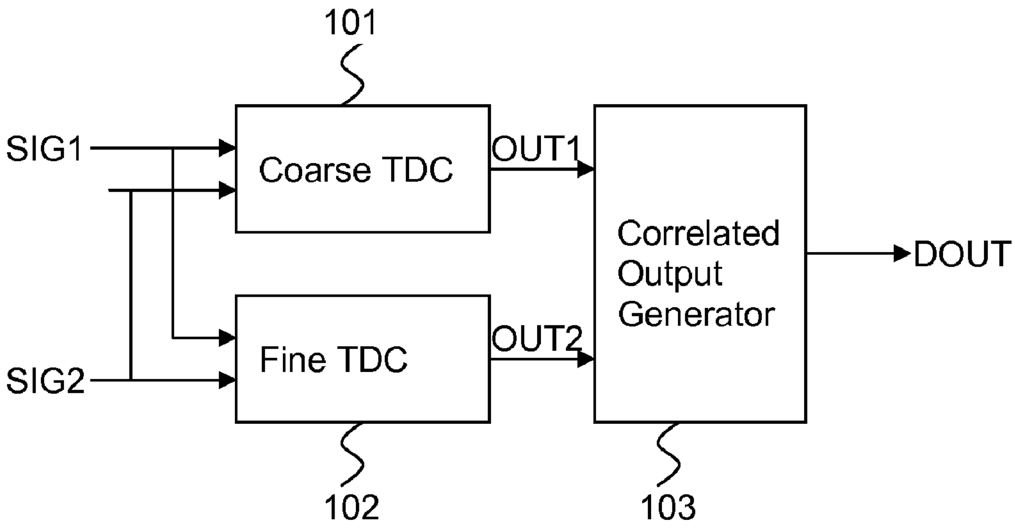
FIG. 1 shows a hybrid coarse-fine time-to-digital converter in accordance with an embodiment of the present invention.
Figure 2A:
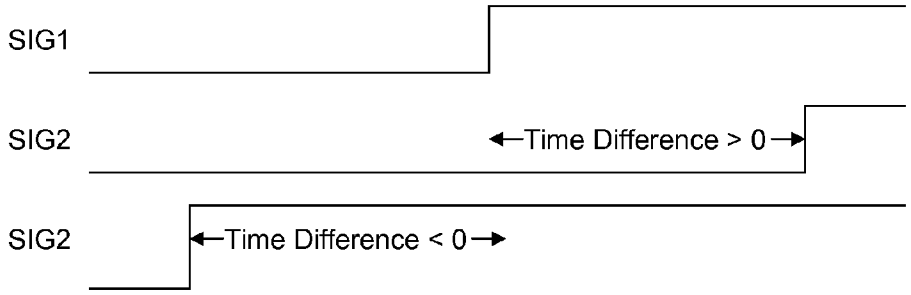
FIG. 2(*a*) shows an input timing diagram of the hybrid coarse-fine time-to-digital converter in FIG. 1.
Figure 2B:
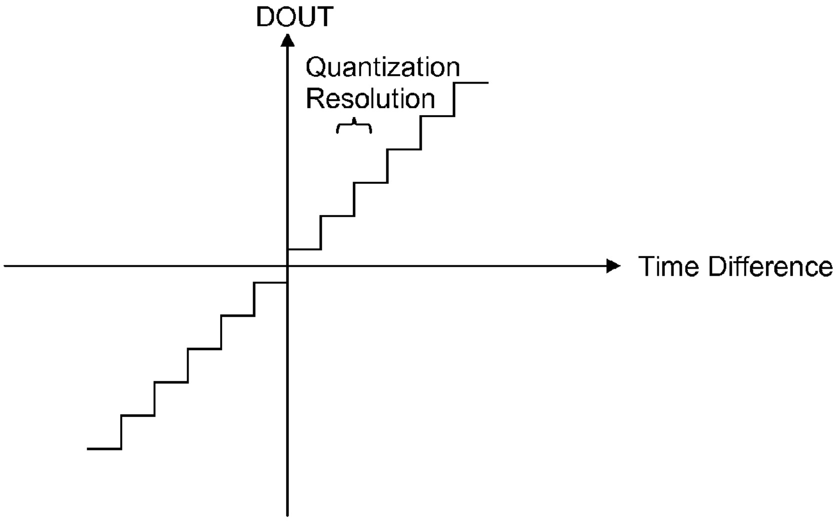

Embodiments of the present invention advantageously allow for fabrication of a time-to-digital converter with fine resolution, small offset, and better linearity. FIG. 1 shows a hybrid coarse-fine time-to-digital converter in accordance with an embodiment of the present invention. The hybrid coarse-fine time-to-digital converter is configured to receive a first input signal SIG1 and a second input signal SIG2 and to generate a digital output DOUT that corresponds to the time difference of between a rising edge of the first input signal and a rising edge of the second input signal. FIG. 2(*a*) shows a positive time difference when the first input signal SIG1 leads the second input signal SIG2 and a negative time difference when the first input signal SIG1 lags the second input signal SIG2. Corresponding to each time difference, the hybrid coarse-fine time-to-digital converter generates the digital output DOUT. FIG. 2(*b*) shows the transfer function curve of the hybrid coarse-fine time-to-digital converter.

The hybrid coarse-fine time-to-digital converter comprises a coarse time-to-digital converter 101, a fine time-to-digital converter 102, and a correlated output generator 103. Corresponding to each time difference between the first and second input signals, the coarse time-to-digital converter 101 generates a first intermediate output OUT1 and the fine time-to-digital converter 102 generates a second intermediate output OUT2. The correlated output generator receives the first intermediate output OUT1 and the second intermediate output OUT2 and generates the digital output DOUT.

FIG. 3(*a*) shows a four-level coarse time-to-digital converter 101A in accordance with an embodiment of the present invention. The coarse time-to-digital converter 101A comprises three flip-flops and two buffers. The first input signal SIG1 samples the second input signal SIG2 to generate a binary signal $Q_1$ at the output of the flip-flop 301. The first input signal SIG1 passes a buffer with delay Δ to generate a signal SIG1D. The signal SIG1D samples the second input signal SIG2 to generate a binary signal $Q_2$ at the output of the flip-flop 302. The second input signal SIG2 passes a buffer with delay Δ to generate a signal SIG2D. The signal SIG2D samples the first input signal SIG1 to generate a binary signal $Q_0$ at the output of the flip-flop 300. FIG. 3(*b*) shows the truth table that maps the output values of the three flip-flops to the first intermediate output OUT1. FIG. 3(*c*) shows the transfer function curve of the coarse time-to-digital converter 101A.

In one embodiment, the coarse time-to-digital converter is a bang-bang detector. FIG. 4(*a*) shows a coarse time-to-digital converter 101B in accordance with an embodiment of the present invention. The coarse time-to-digital converter 101B comprises only a flip-flop 401. The first input signal SIG1 samples the second input signal SIG2 to generate a binary signal $Q_1$ at the output of the flip-flop 401. FIG. 4(*b*) shows the truth table that maps the output value of the flip-flop 401 to the first intermediate output OUT1. FIG. 4(*c*) shows the transfer function curve of the coarse time-to-digital converter 101B.

If a rising edge of the first input signal leads a corresponding rising edge of the second input signal, the flip-flop 401 generates a binary zero at its positive output. If a rising edge of the first input signal lags a corresponding rising edge of the second input signal, the flip-flop 401 generates a binary one at its positive output. The coarse time-to-digital converter 101B generates +1 as the first intermediate output OUT1 if the first input signal SIG1 lags the second input signal SIG2. Otherwise, an output value of −1 is generated as the first intermediate output OUT1.

Figure 5:
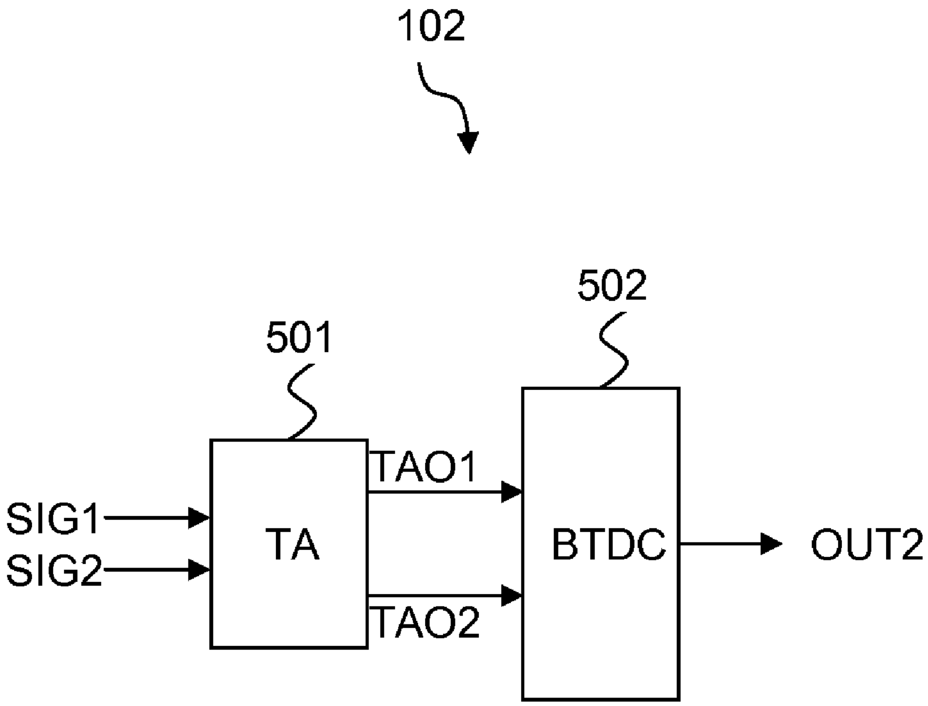
FIG. 5 schematically shows a fine time-to-digital converter in accordance with an embodiment of the present invention.

FIG. 5 shows a fine time-to-digital converter in accordance with an embodiment of the present invention. The fine time-to-digital converter comprises a time amplifier (TA) 501 and a bi-directional time-to-digital converter (BTDC) 502. The time amplifier amplifies the time difference of the two input signals to generate two output signals TAO1 and TAO2. The bi-directional time-to-digital converter 502 measures the amplified time difference of the two signals TAO1 and TAO2 and generates the second intermediate output OUT2. The quantization resolution of the bi-directional time-to-digital converter is equal to $\Delta_{BTDC}$. The quantization resolution of the fine time-to-digital converter is improved by placing the time amplifier 501 at the inputs of the bi-directional time-to-digital converter 502. The resultant resolution $\Delta_F$ of the fine time-to-digital converter is equal to $\Delta_{BTDC}/A$ where A is the amplification gain of the time amplifier. Although the quantization resolution is improved due to the cascaded time amplifier, the device mismatches in the time amplifier further shifts the zero crossing of the transfer function curve of the fine time-to-digital converter and degrades the linearity.

Figure 6A:
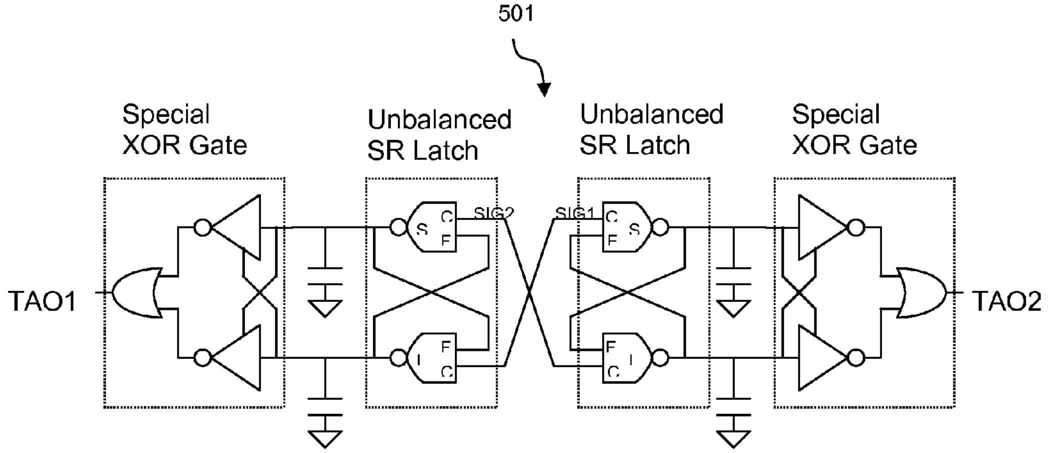
FIG. 6(*a*) shows a time amplifier in accordance with an embodiment of the present invention.
Figure 6B:
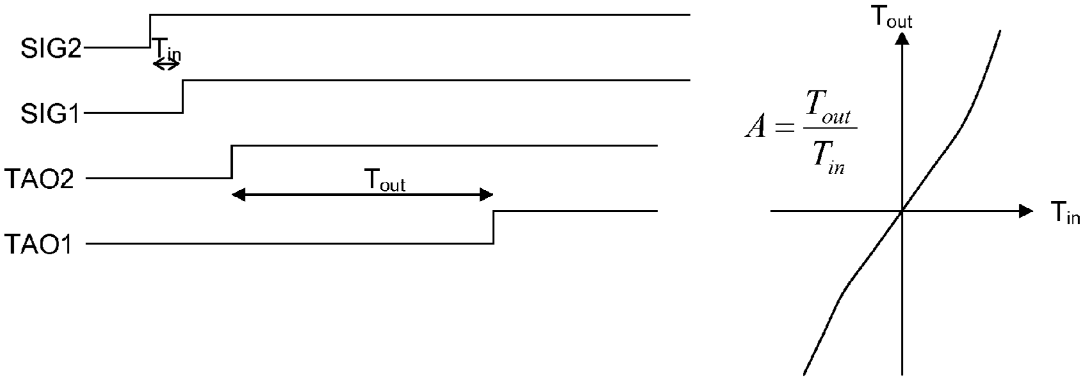

FIG. 6(*a*) shows a time amplifier in accordance with an embodiment of the present invention. The time amplifier comprises two unbalanced SR latches, two special XOR gates, and four output capacitances. The unbalanced SR latch comprises two NAND gates, in which the size of the NMOS of one NAND gate is larger or smaller than the size of the NMOS of the other NAND gate. With this method, a TA gain of 20 can be obtained. The special XOR gate comprises an OR gate and two inverters where one inverter's input is used as the power supply of the other inverter and vice versa. The output of the special XOR is binary one if and only if one input of the special XOR gate is a binary one and the other input is a binary zero. A normal XOR gate cannot be used because its output is unstable when the inputs to the XOR gate do not reach binary levels during time amplification. FIG. 6(*b*) shows the timing diagram of the time amplifier. The gain of the time amplifier is defined as the ratio of the output time difference $T_{out}$ and the input time difference $T_{in}$.

Figure 7:
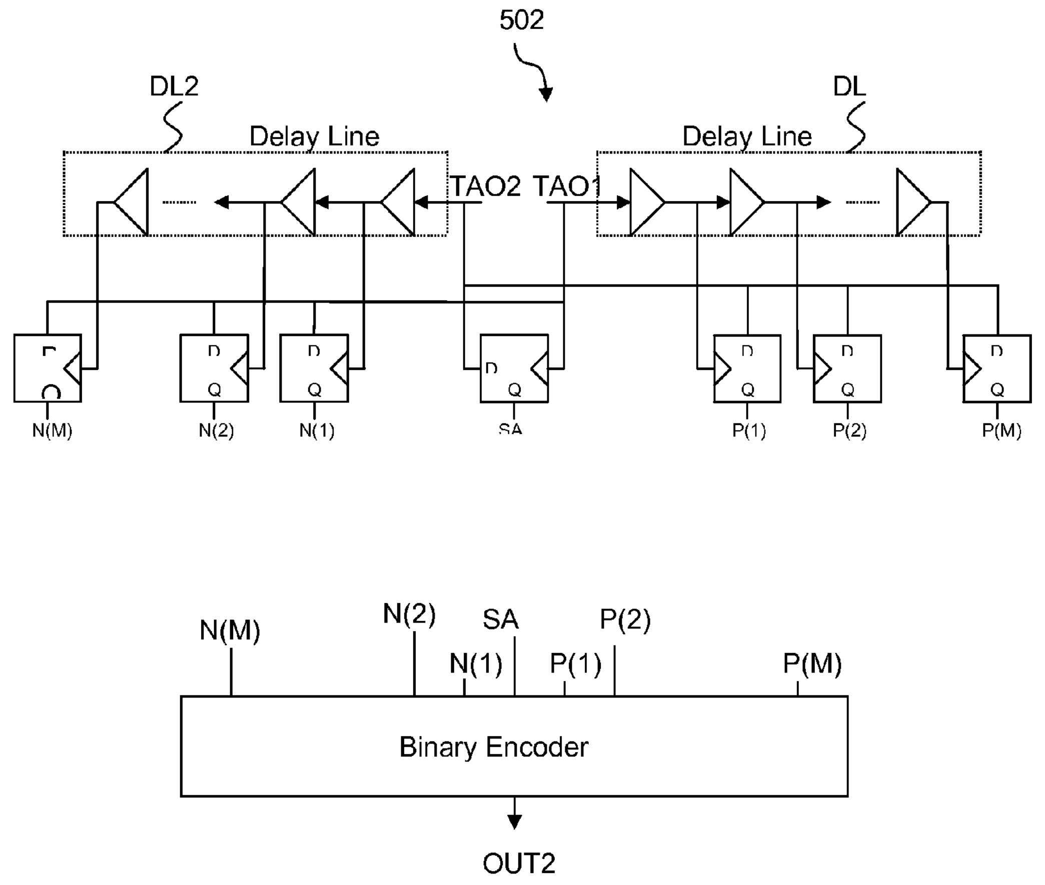
FIG. 7 shows a bi-directional time-to-digital converter used in the fine time-to-digital converter in accordance with an embodiment of the present invention.

FIG. 7 shows a bi-directional time-to-digital converter in accordance with an embodiment of the present invention. The bi-directional time-to-digital converter comprises two delay lines, a group of flip-flops, and a thermometer-to-binary encoder. The delay line comprises a plurality of delay elements. Each of the delay elements is a buffer. The signal TAO1 is coupled to the input of the first delay line DL1 to generate a plurality of output signals to sample the signal TAO2. The sampled results from P(1) to P(M) are stored in the flip-flops. The signal TAO2 is coupled to the input of the second delay line DL2 to generate a plurality of output signals to sample the signal TAO1. The sampled results from N(1) to N(M) are stored in the flip-flops. The signal TAO1 is also employed to sample the signal TAO2 and the sampled result SA indicates the lead/lag phase relationship between TAO1 and TAO2. The thermometer-to-binary encoder receives the sampled results and generates the second intermediate output OUT2.

Figure 8:
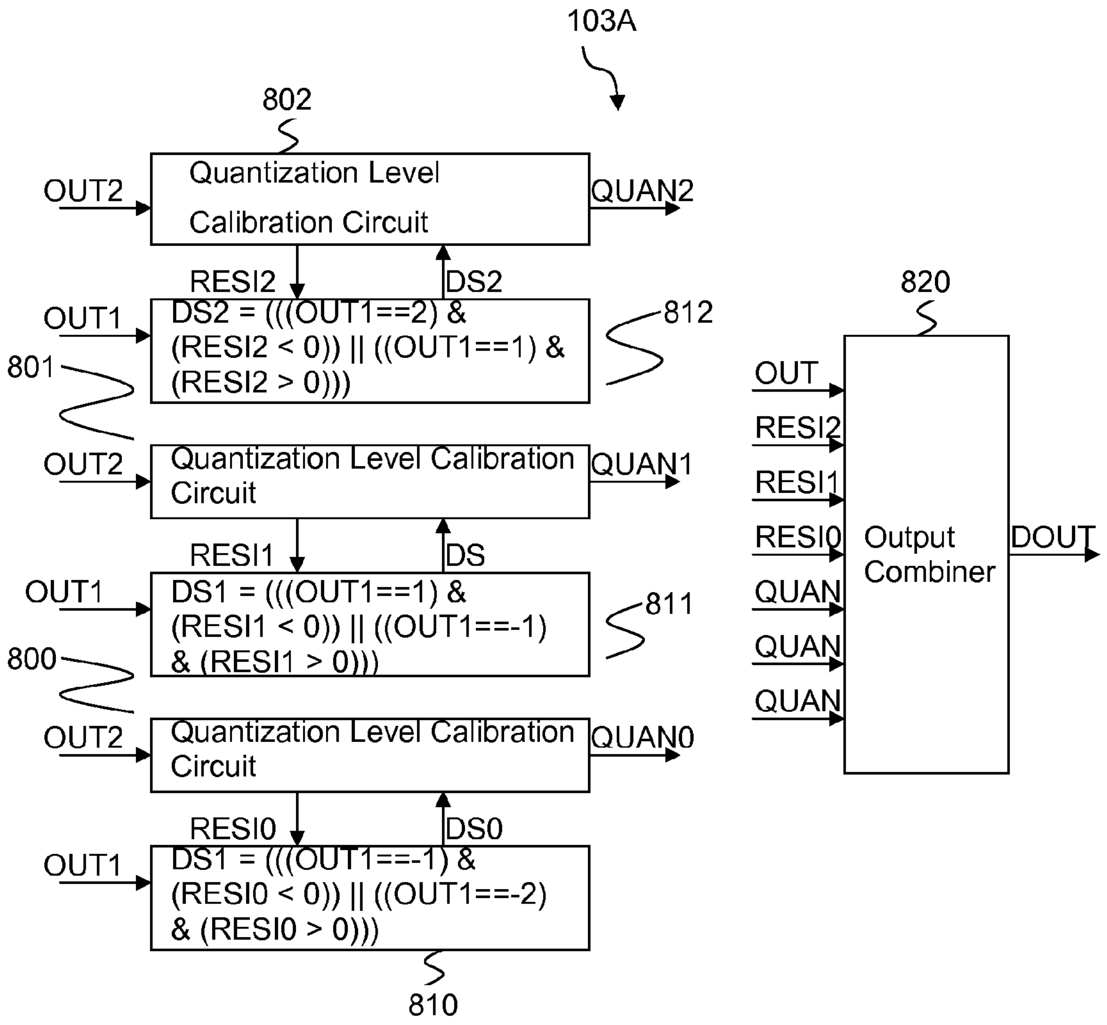
FIG. 8(*a*) shows a correlated output generator in accordance with an embodiment of the present invention.
Figure 8:
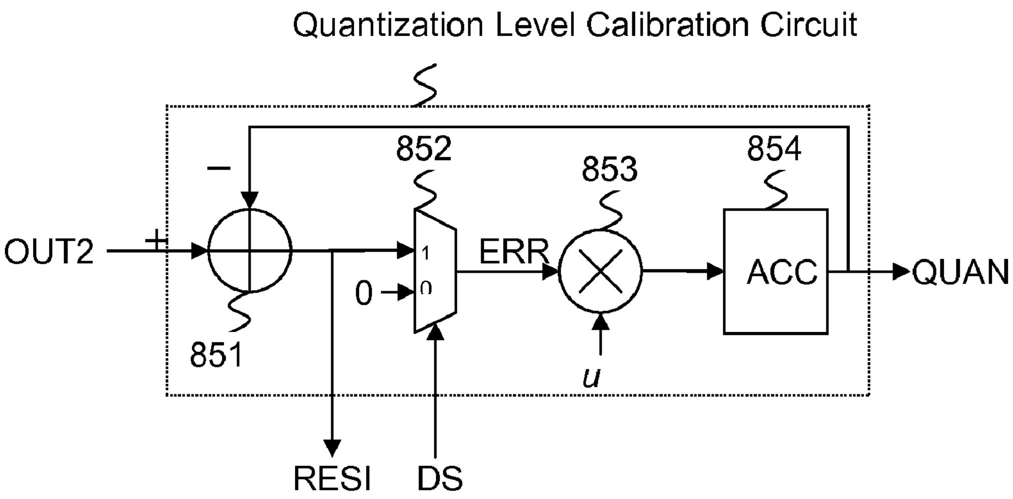
Figure 8:
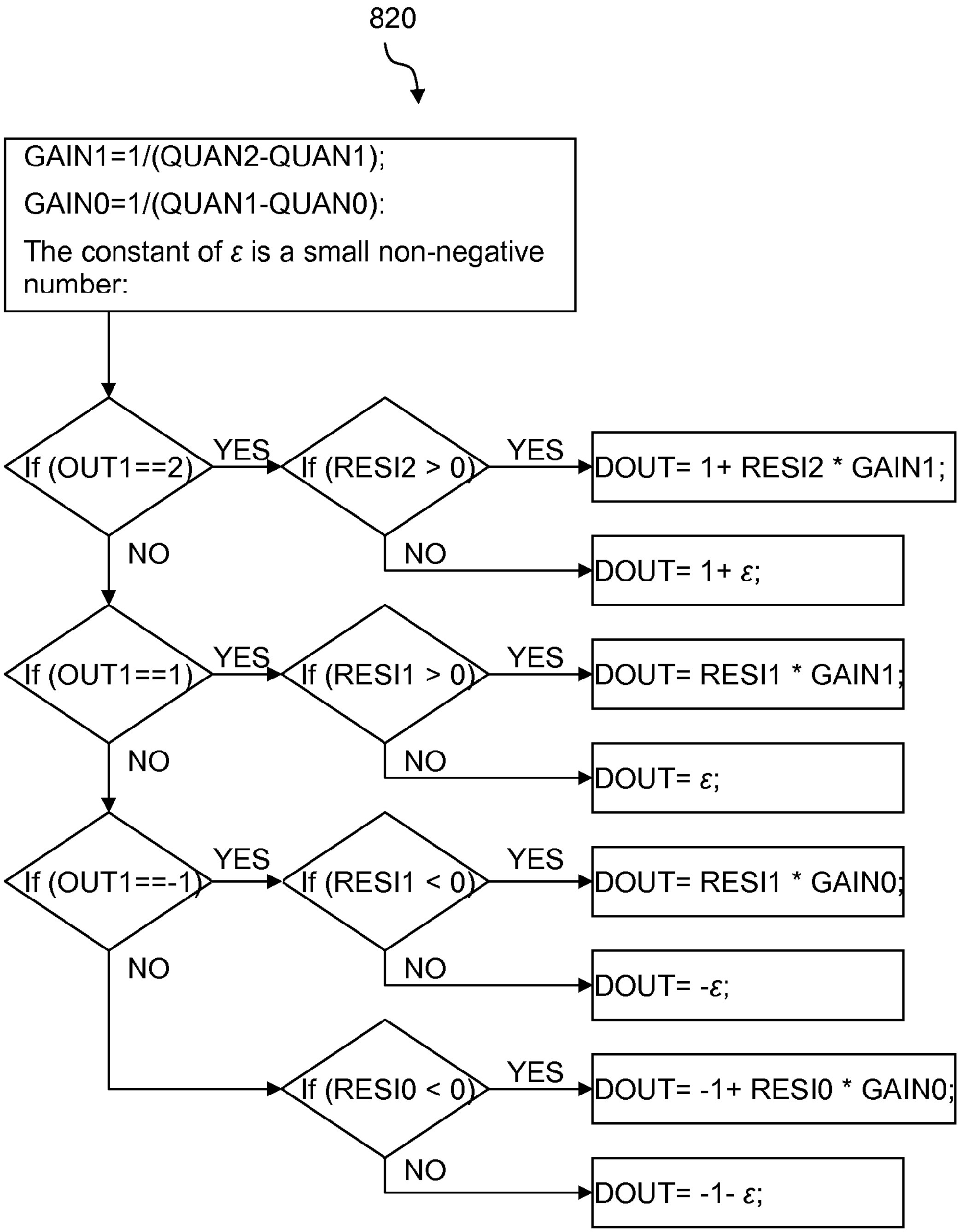

FIG. 8(*a*) shows a correlated output generator 103A in accordance with an embodiment of the present invention. The coarse time-to-digital converter 101A is in use with the correlated output generator 103A which comprises three quantization level calibration circuits, three adaptation decision circuits, and an output combiner. A quantization level calibration circuit is configured to receive the second intermediate output OUT2 and a binary decision signal DS from a corresponding adaptation decision circuit and to generate a quantization level QUAN corresponding to a first intermediate output transition and a residue RESI to the corresponding adaptation decision circuit. The quantization level calibration circuit 800 generates the quantization level QUAN0 corresponding to the first intermediate output transition between −2 and −1. The quantization level calibration circuit 801 generates the quantization level QUAN1 corresponding to the first intermediate output transition between −1 and −1. The quantization level calibration circuit 802 generates the quantization level QUAN2 corresponding to the first intermediate output transition between +1 and +2.

An adaptation decision is configured to receive the first intermediate output OUT1 and a residue RESI from a corresponding quantization level calibration circuit and to generate a binary decision signal DS to the corresponding quantization level calibration circuit. The adaptation decision circuit 810 receives the first intermediate output OUT1 and the residue RES0 and generates a binary decision signal DS0 to the quantization level calibration circuit 800 that indicates if the quantization level QUAN0 needs an update. The adaptation decision circuit 811 receives the first intermediate output OUT1 and the residue RES1 and generates a binary decision signal DS1 to the quantization level calibration circuit 801 that indicates if the quantization level QUAN1 needs an update. The adaptation decision circuit 812 receives the first intermediate output OUT1 and the residue RES2 and generates a binary decision signal DS2 to the quantization level calibration circuit 802 that indicates if the quantization level QUAN2 needs an update. The output combiner 820 generates the digital output DOUT in accordance with to the first intermediate output OUT1, the residue RESI2, the residue RESI1, the residue RESI0, the quantization level QUAN2, the quantization level QUAN1, and the quantization level QUAN0.

FIG. 8(*b*) shows a quantization level calibration circuit in accordance with an embodiment of the present invention. The quantization level calibration circuit is configured to receive the second intermediate output OUT2 and the binary decision signal DS and to generate the quantization level QUAN and the residue RESI. The quantization level calibration circuit comprises an adder 851, a multiplexer 852, a multiplier 853, and an accumulator 854. The adder 851 subtracts the current quantization level QUAN from the second intermediate output OUT2 to obtain the residue RESI. If the decision signal DS is a binary one, the residue is then scaled in the multiplier 853 and added to the current quantization level QUAN in the accumulator 854. If the decision signal DS is a binary zero, the current quantization level QUAN keeps unchanged.

The decision circuit is configured to receive the first intermediate output OUT1 and the residue RESI from a corresponding quantization level calibration circuit and to generate the decision signal DS to the corresponding quantization level calibration circuit. In the quantization level calibration circuit 812, if the first intermediate output OUT1 is 2 and the residue RESI2 is negative, it means that the current quantization level QUAN2 is too high and the negative residue RESI2 is scaled and added to the current quantization level QUAN2. If the first intermediate output OUT1 is 1 and the residue is positive, it means that the current quantization level QUAN2 is too low and the positive residue RESI2 is scaled and added to the current quantization level QUAN2.

In the quantization level calibration circuit 811, if the first intermediate output OUT1 is 1 and the residue RESI1 is negative, it means that the current quantization level QUAN1 is too high and the negative residue RESI1 is scaled and added to the current quantization level QUAN1. If the first intermediate output OUT1 is −1 and the residue is positive, it means that the current quantization level QUAN1 is too low and the positive residue RESI1 is scaled and added to the current quantization level QUAN1.

In the quantization level calibration circuit 810, if the first intermediate output OUT1 is −1 and the residue RESI0 is negative, it means that the current quantization level QUAN0 is too high and the negative residue RESI0 is scaled and added to the current quantization level QUAN0. If the first intermediate output OUT1 is −2 and the residue is positive, it means that the current quantization level QUAN0 is too low and the positive residue RESI0 is scaled and added to the current quantization level QUAN0.

FIG. 8(*c*) shows a method to generate the digital output DOUT in accordance with an embodiment of the present invention. If the first intermediate output OUT1 is positive, a normalization gain GAIN1 is used to normalize the digital output DOUT. If the first intermediate output OUT1 is negative, a normalization gain GAIN2 is used to normalize the digital output DOUT.

Figure 9:
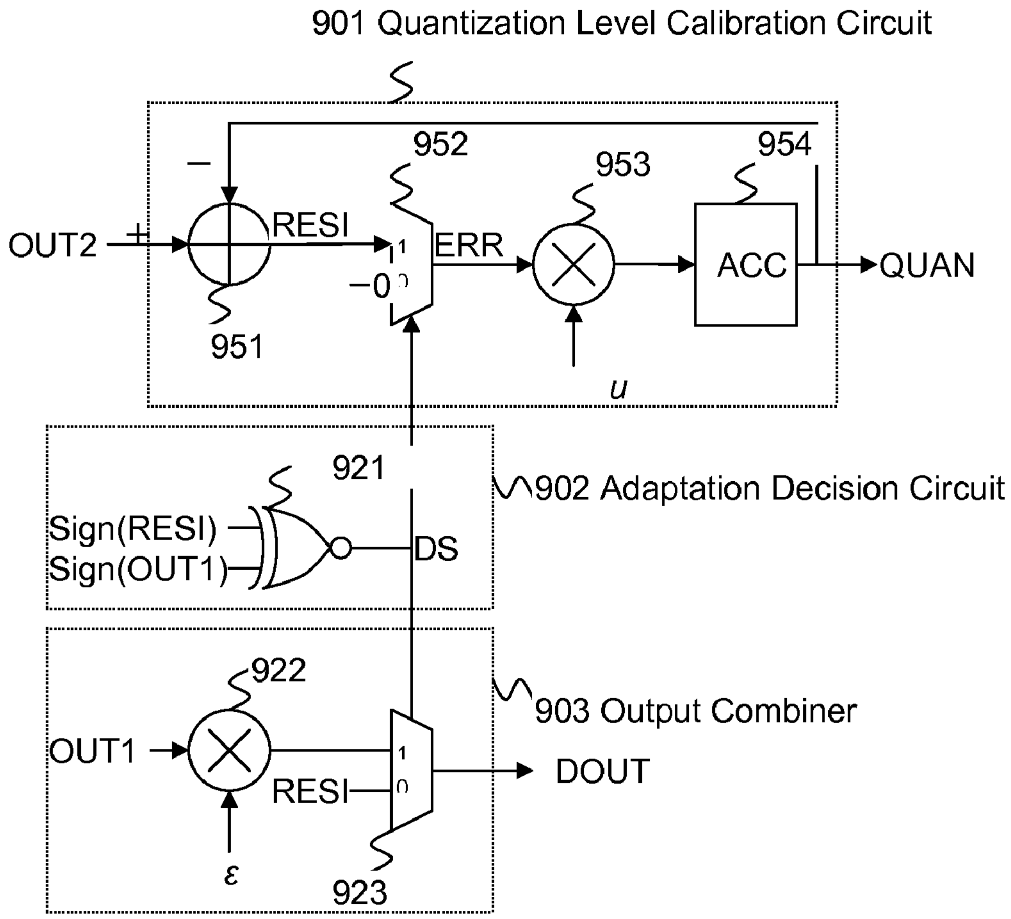
FIG. 9 shows a correlated output generator in accordance with an embodiment of the present invention.

FIG. 9 shows a correlated output generator 103B in accordance with an embodiment of the present invention. The coarse time-to-digital converter 101B is in use with the correlated output generator 103B which comprises a quantization level calibration circuit 901, an adaptation decision circuit 902, and an output combiner 903. The quantization level QUAN generated by the quantization level calibration circuit 901 represents the offset of the fine time-to-digital converter 102. The residue RESI generated by the quantization level calibration circuit 901 represents an offset free data. The adaptation decision circuit 902 includes only an exclusive OR logic gate 921 and generate a binary decision signal DS. The binary decision signal DS is a binary one if the sign bit of the first intermediate output OUT1 is different from the sign bit of the residue RESI. If the binary decision signal DS is a binary one, the digital output DOUT is a small positive number $\epsilon$ if the first intermediate output OUT1 is positive and a small negative number $-\epsilon$ if the first intermediate output OUT1 is negative. If the binary decision signal DS is a binary zero, the digital output DOUT is the residue RESI.

A hybrid coarse-fine time-to-digital converter has been disclosed. While specific embodiments of the present invention have been provided, it is to be understood that these embodiments are for illustration purposes and not limiting. Many additional embodiments will be apparent to persons of ordinary skill in the art reading this disclosure.

A phase-locked loop has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for receiving a first input signal and a second input signal and generating a digital output corresponding to a time difference between the first input signal and the second input signal, the apparatus comprising:

a first time-to-digital converting circuit (TDC) to generate a first intermediate output corresponding to the time difference;

a second TDC to generate a second intermediate output corresponding to the time difference, wherein a linearity of the first intermediate output is better than a linearity of the second intermediate output and a quantization resolution of the second intermediate output is finer than a quantization resolution of the first intermediate output;

a correlated output generating circuit, coupled to the first and the second TDCs, to generate a quantization level corresponding to a transition of the first intermediate output, and to map the first and second intermediate outputs to the digital output according to the quantization level.

2. The apparatus of claim 1, wherein the second TDC comprises:

a time amplifier to amplify the time difference of the two input signals to generate two output signals; and a bi-directional time-to-digital converter to measure an amplified time difference of the two signals and generates the second intermediate output.

3. The apparatus of claim 2, wherein the time amplifier comprises two unbalanced SR latches.

4. The apparatus of claim 3, wherein the unbalanced SR latch comprises two logic gates, in which a size of the MOS (metal oxide semiconductor) of one logic gate is larger or smaller than a size of the MOS of the other logic gate.

5. The apparatus of claim 2, wherein a gain of the time amplifier is defined as a ratio of an output time difference and an input time difference.

6. The apparatus of claim 2, wherein the bi-directional time-to-digital converter comprises two delay lines, a group of flip-flops, and a thermometer-to-binary encoder.

7. The apparatus of claim 2, wherein the correlated output generating circuit comprises:

a plurality of adaptation decision and quantization level calibration circuits to receive the first intermediate output and the second intermediate output, and to generate a plurality of quantization levels; and an output combiner, coupled to the plurality of adaptation decision and quantization level calibration circuits, to generate the digital output in accordance with to the first intermediate output, and the plurality of the quantization levels.

8. The apparatus of claim 7, wherein each of the plurality of adaptation decision and quantization level calibration circuits comprises an adaptation decision circuit and a quantization level calibration circuit.

9. The apparatus of claim 8, wherein the quantization level calibration circuit comprises an adder, a multiplexer, a multiplier, and an accumulator.

10. The apparatus of claim 2, wherein the correlated output generating circuit comprises:

a quantization level calibration circuit to generate a quantization level which represents an offset of the second TDC, and to generate a residue signal which represents an offset free data; and an adaptation decision circuit to generate a decision signal; and an output combiner to generate the digital output in accordance with the first intermediate output, the residue signal, and the decision signal.

11. A method for generating a digital output corresponding to a time difference between a first input signal and a second input signal, the method comprising:

utilizing a first time-to-digital converting circuit (TDC) to generate a first intermediate output corresponding to the time difference;

utilizing a second TDC to generate a second intermediate output corresponding to the time difference;

generating a quantization level corresponding to a transition of the first intermediate output; and mapping the first and second intermediate outputs to the digital output according to the quantization level;

wherein a linearity of the first intermediate output is better than a linearity of the second intermediate output, and a quantization resolution of the second intermediate output is finer than a quantization resolution of the first intermediate output.

12. The method of claim 11, wherein the step of generating the second intermediate output comprises:

utilizing a time amplifier to amplify the time difference of the two input signals to generate two output signals; and measuring an amplified time difference of the two signals to generate the second intermediate output.

13. The method of claim 12, wherein the time amplifier comprises two unbalanced SR latches.

14. The method of claim 13, wherein the unbalanced SR latch comprises two logic gates, in which a size of the MOS (metal oxide semiconductor) of one logic gate is larger or smaller than a size of the MOS of the other logic gate.

15. The method of claim 12, wherein a gain of the time amplifier is defined as a ratio of an output time difference and an input time difference.

16. The method of claim 11, wherein the step of mapping the first and second intermediate outputs to the digital output comprises:

generating a quantization level which represents an offset of the second TDC, generating a residue signal which represents an offset free data; and generating a decision signal according to the first intermediate output and the residue signal; and generating the digital output in accordance with the first intermediate output, the residue signal, and the decision signal.

17. The method of claim 11, wherein the step of mapping the first and second intermediate outputs to the digital output comprises:

generating a plurality of quantization levels according to the first intermediate output and the second intermediate output; and generating a plurality of residue signals according to the second intermediate output and the quantization levels; and generating the digital output in accordance with to the first intermediate output, the second intermediate output, the plurality of residue signals and the plurality of the quantization levels.

* * * * *